United States Patent
Lee

(10) Patent No.: US 7,732,300 B2
(45) Date of Patent: Jun. 8, 2010

(54) METHOD OF BONDING ALUMINUM ELECTRODES OF TWO SEMICONDUCTOR SUBSTRATES

(75) Inventor: Byoung Su Lee, Yeosu-si (KR)

(73) Assignee: Siliconfile Technologies, Inc., Seoul (KR)

( * ) Notice: Subject to any disclaimer, the term of this patent is extended or adjusted under 35 U.S.C. 154(b) by 0 days.

(21) Appl. No.: 11/817,761

(22) PCT Filed: Mar. 2, 2006

(86) PCT No.: PCT/KR2006/000712

§ 371 (c)(1),
(2), (4) Date: Aug. 7, 2008

(87) PCT Pub. No.: WO2006/093386

PCT Pub. Date: Sep. 8, 2006

(65) Prior Publication Data

US 2008/0293184 A1    Nov. 27, 2008

(30) Foreign Application Priority Data

Mar. 4, 2005    (KR) ............. 10-2005-0017955

(51) Int. Cl.
*H01L 21/46* (2006.01)
(52) U.S. Cl. ............ 438/455; 438/107; 257/459; 257/E23.02; 257/E23.04; 257/E23.088; 257/E21.499; 257/E21.705
(58) Field of Classification Search ........ 438/455, 438/107; 257/459, E23.02, E23.04, E23.088, 257/48, 519, 705, E21.499
See application file for complete search history.

(56) References Cited

U.S. PATENT DOCUMENTS

| | | | | |
|---|---|---|---|---|
| 4,854,495 A | * | 8/1989 | Yamamoto et al. | 228/124.1 |
| 4,890,784 A | * | 1/1990 | Bampton | 228/194 |
| 6,583,514 B2 | * | 6/2003 | Tago et al. | 257/778 |
| 2002/0037435 A1 | * | 3/2002 | Hirashima et al. | 428/693 |
| 2005/0042838 A1 | * | 2/2005 | Garyainov et al. | 438/455 |
| 2006/0292823 A1 | * | 12/2006 | Ramanathan et al. | 438/455 |

* cited by examiner

*Primary Examiner*—Charles D Garber
*Assistant Examiner*—Yasser A Abdelaziez
(74) *Attorney, Agent, or Firm*—Jae Y. Park; Kile Goekjian Reed & McManus

(57) ABSTRACT

A method of bonding aluminum (Al) electrodes formed on two semiconductor substrates at a low temperature that does not affect circuits formed on the two semiconductor substrates is provided. The method includes: (a) forming aluminum (Al) electrodes on the two semiconductor substrates, respectively, and depositing a metal alloy that comprises aluminum (Al) and copper (Cu) onto the aluminum (Al) electrodes; (b) arranging the aluminum (Al) electrodes of the two semiconductor substrates to face with each other; and (c) heating the aluminum (Al) electrodes at a temperature lower than the melting point of the deposited metal alloy, and applying a specific pressure onto the two semiconductor substrates. Accordingly, bonding can be carried out at a temperature lower than the melting point of an $Al_{0.83}Cu_{0.17}$ alloy without having an effect on circuits formed on two semiconductor substrates, and can be selectively carried out at regions where pressure is applied.

4 Claims, 1 Drawing Sheet

[Fig. 1]
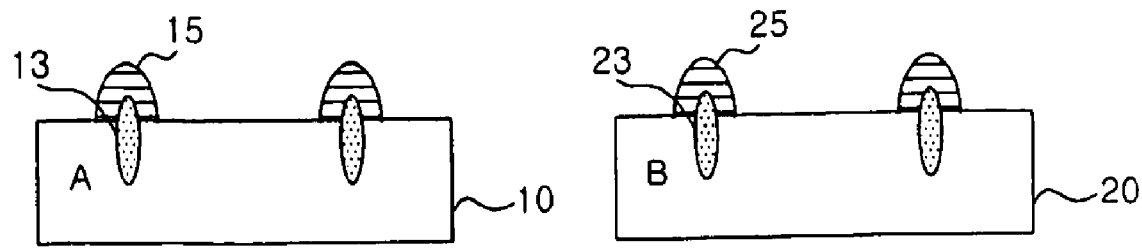
[Fig. 2]
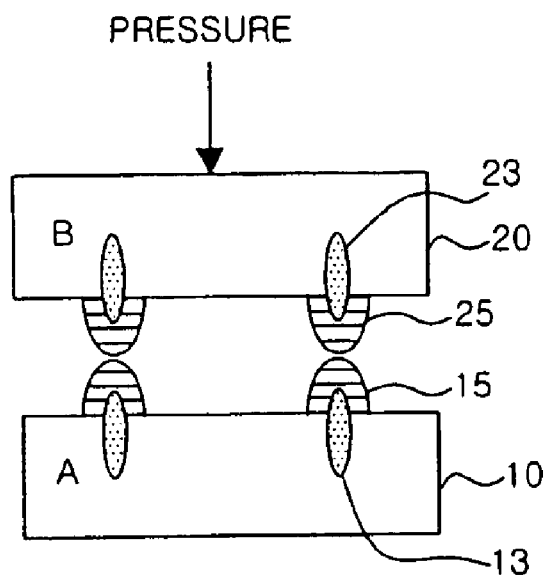
[Fig. 3]
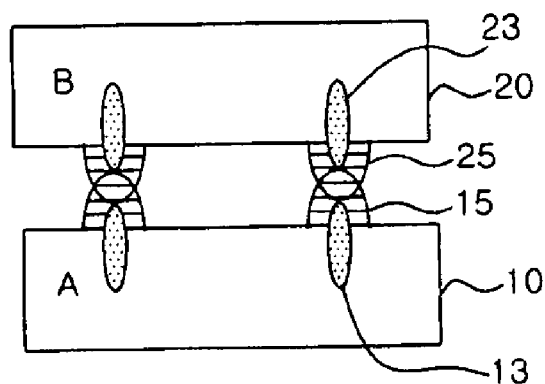

METHOD OF BONDING ALUMINUM ELECTRODES OF TWO SEMICONDUCTOR SUBSTRATES

TECHNICAL FIELD

The present invention relates to a semiconductor manufacturing process, and more particularly, to a method of bonding metal wires of two overlapped substrates in the process of manufacturing a semiconductor.

BACKGROUND ART

Electrodes, in general, are bonded in a semiconductor manufacturing process by using alloys having low melting points, such as lead (Pb), tin (Sn), and bismuth (Bi). The alloys, however, are harmful to human body, and may contaminate semiconductor manufacturing equipments due to low vapor pressure.

Aluminum (Al) is commonly used for a metal electrode in most semiconductor manufacturing processes. In case that an aluminum (Al) electrode is bonded such that two substrates are overlapped having the aluminum (Al) electrode in therebetween, the aluminum (Al) electrode may be heated near to its melting point. Due to the heating of the aluminum (Al) electrode, remaining regions of the aluminum (Al) electrode, which are not bonding areas, also melt, which in turn has an adverse effect on existing wires or circuits of the substrates.

DISCLOSURE OF INVENTION

Technical Problem

In order to solve the aforementioned problems, an object of the present invention is to provide a method of bonding aluminum (Al) electrodes formed on two semi-conductor substrates at a low temperature that does not affect circuits formed on the two semiconductor substrates, without contaminating semiconductor manufacturing equipments.

Technical Solution

According to an aspect of the present invention, there is provided a method for bonding aluminum (Al) electrodes of two semiconductor substrates, comprising: (a) forming aluminum (Al) electrodes on the two semiconductor substrates, respectively, and depositing a metal alloy that comprises aluminum (Al) and copper (Cu) onto the aluminum (Al) electrodes; (b) arranging the aluminum (Al) electrodes of the two semi-conductor substrates to face with each other; and (c) heating the aluminum (Al) electrodes at a temperature lower than the melting point of the deposited metal alloy, and applying a specific pressure onto the two semiconductor substrates.

In the present invention, the metal alloy may be an $Al_{0.83}Cu_{0.17}$ alloy.

DESCRIPTION OF DRAWINGS

FIGS. 1 to 3 show a process of bonding aluminum (Al) electrodes formed on two semiconductor substrates according to an embodiment of the present invention.

BEST MODE

Hereinafter, the present invention will be described in detail with reference to accompanying drawings.

FIGS. 1 to 3 show a process of bonding aluminum (Al) electrodes formed on two semiconductor substrates according to an embodiment of the present invention.

FIG. 1 shows aluminum (Al) electrodes formed on two semiconductor substrates.

Aluminum (Al) electrodes 13 and 23 to be bonded are formed on semiconductor substrates 10 and 20, and $Al_{0.83}Cu_{0.17}$ alloys 15 and 25 are deposited thereon.

FIG. 2 shows a process of bonding the aluminum (Al) electrodes on the semi-conductor substrates.

With the aluminum (Al) electrodes 13 and 23 to be bonded being overlapped, the semiconductor substrates 10 and 20 are heated with a temperature lower than the melting point of the $Al_{0.83}Cu_{0.17}$ alloys 15 and 25, and a specific pressure is applied onto the semiconductor substrates 10 and 20.

Due to the pressure applied onto the semiconductor substrates 10 and 20, the aluminum (Al) electrodes 13 and 23 to be bonded are pressed, and thus the $Al_{0.83}Cu_{0.17}$ alloys 15 and 25 melt at a temperature that is lower than a melting point of the $Al_{0.83}Cu_{0.17}$ alloys 15 and 25 at atmospheric pressure.

The melting point of the $Al_{0.83}Cu_{0.17}$ alloys 15 and 25 is about 540° C., which is far lower than the melting point of the aluminum (Al) electrodes 13 and 23, that is, 650° C., thereby suitable for a fusion junction. Aluminum (Al) and copper (Cu) are uniformly mixed in the $Al_{0.83}Cu_{0.17}$ alloys 15 and 25.

FIG. 3 shows bonding of the aluminum (Al) electrodes to the semiconductor substrates.

When the $Al_{0.83}Cu_{0.17}$ alloys 15 and 25 are deposited on the aluminum (Al) electrodes 13 and 23, and then are heated, the region where the $Al_{0.83}Cu_{0.17}$ alloys 15 and 25 are deposed melts faster than the region of the aluminum (Al) electrodes 13 and 23, thereby preventing thermal damage at regions that are out of a junction portion.

In addition, contamination does not occur in the semiconductor manufacturing process, since typical alloy metals such as aluminum (Al) and copper (Cu) are used in the manufacturing process. Copper (Cu) diffusion from an alloy coated at a high temperature to an aluminum (Al) electrode has an effect on lowering the melting point of the Al electrode, but does not have a significant effect on junction since the melting point of the alloy formed by such diffusion is higher than the melting point of its original alloy.

While the present invention has been particularly shown and described with reference to exemplary embodiments thereof, it will be understood by those skilled in the art that various changes in form and details may be made therein without departing from the spirit and scope of the invention as defined by the appended claims.

INDUSTRIAL APPLICABILITY

Accordingly, in the present invention, bonding can be carried out at a temperature lower than the melting point of an $Al_{0.83}Cu_{0.17}$ alloy without having an effect on circuits formed on two semiconductor substrates, and can be selectively carried out at regions where pressure is applied.

The invention claimed is:

1. A method for bonding aluminum (Al) electrodes of semiconductor substrates, comprising:
   (a) forming first and second aluminum (Al) electrodes on first and second semiconductor substrates, respectively;
   (b) depositing a metal alloy that comprises aluminum (Al) and copper (Cu) onto the first and second aluminum (Al) electrodes;
   (c) arranging the aluminum (Al) electrodes of the first and second semiconductor substrates to face and overlap with each other such that the metal alloy deposited on the first aluminum (Al) electrode comes into contact with the metal alloy deposited on the second aluminum (Al) electrode; and (d) heating the aluminum (Al) electrodes at a temperature lower than a melting point of the deposited metal alloy, and applying a specific pressure onto the two semiconductor substrates, wherein the heating and applying a specific pressure of step (d) is performed after the depositing a metal alloy onto the first and second aluminum (Al) electrodes of step (b) and arranging the aluminum (Al) electrodes to face and overlap with each other of step (c) are performed.

2. The method according to claim 1, wherein the metal alloy is an $Al_{0.83}Cu_{0.17}$ alloy.

3. The method according to claim 1, wherein the temperature in the (d) is lower than about 540° C.

4. The method according to claim 1, wherein the forming first and second aluminum (Al) electrodes of step (a) includes forming the first and second aluminum (Al) electrodes to each have an oval shape in cross-sectional view; and the depositing a metal alloy of step (b) includes forming the metal alloy to have a half-circle shape in cross-sectional view, and surrounding a part of the respective aluminum (Al) electrodes with the metal alloy.

* * * * *